(12) United States Patent
Jun et al.

(10) Patent No.: US 10,446,392 B2
(45) Date of Patent: Oct. 15, 2019

(54) SELF-ALIGNED NANODOTS FOR 3D NAND FLASH MEMORY

(71) Applicant: Applied Materials, Inc., Santa Clara, CA (US)

(72) Inventors: Sungwon Jun, San Jose, CA (US); Saurabh Chopra, Santa Clara, CA (US); Thomas Jongwan Kwon, Dublin, CA (US); Er-Xuan Ping, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1 day.

(21) Appl. No.: 15/881,405

(22) Filed: Jan. 26, 2018

(65) Prior Publication Data

US 2018/0233359 A1 Aug. 16, 2018

Related U.S. Application Data

(60) Provisional application No. 62/457,227, filed on Feb. 10, 2017.

(51) Int. Cl.
*H01L 21/20* (2006.01)
*H01L 21/02* (2006.01)
(Continued)

(52) U.S. Cl.
CPC ........ *H01L 21/02601* (2013.01); *C23C 16/04* (2013.01); *C23C 16/06* (2013.01);
(Continued)

(58) Field of Classification Search
CPC ......... H01L 21/02601; H01L 29/42332; H01L 21/28273; H01L 21/02592; H01L 21/0262;
(Continued)

(56) References Cited

U.S. PATENT DOCUMENTS 6,346,452 B1 * 2/2002 Kabir ..................... H01L 29/36
257/19
6,406,960 B1 6/2002 Hopper et al.
(Continued)

OTHER PUBLICATIONS

International Search Report and Written Opinion for Application No. PCT/US2018/016965 dated May 18, 2018.

*Primary Examiner* — Vu A Vu
(74) *Attorney, Agent, or Firm* — Patterson + Sheridan LLP (57) ABSTRACT

A method of forming a 3D NAND structure having self-aligned nanodots includes depositing alternating layers of an oxide and a nitride on a substrate; at least partially recessing the nitride layers; and forming SiGe nanodots on the nitride layers. A method of forming a 3D NAND structure having self-aligned nanodots includes depositing alternating layers of an oxide and a nitride on a substrate; at least partially recessing the nitride layers; and forming SiGe nanodots on the nitride layers by a process including maintaining a temperature of the substrate below about 560° C.; flowing a silicon epitaxy precursor into the chamber; forming a silicon epitaxial layer on the substrate at the nitride layers; flowing germanium gas into the chamber with the silicon epitaxy precursor; and forming a silicon germanium epitaxial layer on the substrate at the nitride layers.

1 Claim, 5 Drawing Sheets

(51) Int. Cl.
*H01L 21/28* (2006.01)
*C23C 16/06* (2006.01)
*H01L 29/423* (2006.01)
*C23C 16/04* (2006.01)
*C23C 16/24* (2006.01)
*C23C 16/34* (2006.01)
*C23C 16/40* (2006.01)
*C23C 16/452* (2006.01)
*C23C 16/50* (2006.01)
*C30B 25/18* (2006.01)
*C30B 29/52* (2006.01)
*C30B 29/60* (2006.01)
*H01L 27/11556* (2017.01)

(52) U.S. Cl.
CPC ............ *C23C 16/24* (2013.01); *C23C 16/345* (2013.01); *C23C 16/401* (2013.01); *C23C 16/452* (2013.01); *C23C 16/50* (2013.01); *C30B 25/183* (2013.01); *C30B 29/52* (2013.01); *C30B 29/60* (2013.01); *H01L 21/0262* (2013.01); *H01L 21/02488* (2013.01); *H01L 21/02507* (2013.01); *H01L 21/02532* (2013.01); *H01L 21/02592* (2013.01); *H01L 21/02639* (2013.01); *H01L 21/28273* (2013.01); *H01L 29/42332* (2013.01); *H01L 27/11556* (2013.01)

(58) Field of Classification Search
CPC ......... H01L 21/02639; H01L 21/02532; H01L 21/02507; H01L 21/02488; H01L 27/11556; C23C 16/50; C23C 16/452; C23C 16/401; C23C 16/345; C23C 16/24; C23C 16/04; C23C 16/06; C30B 25/02
USPC ........................................................ 438/479
See application file for complete search history.

(56) References Cited

U.S. PATENT DOCUMENTS

| | | | |
|---|---|---|---|
| 7,498,632 B2 * | 3/2009 | Lee | ........................ B82Y 10/00 257/288 |
| 2008/0113186 A1 | 5/2008 | Kouvetakis et al. | |
| 2008/0246078 A1 | 10/2008 | Huo et al. | |
| 2011/0281390 A1 | 11/2011 | Hieslmair et al. | |
| 2015/0333162 A1 | 11/2015 | Bouche et al. | |
| 2016/0293617 A1 | 10/2016 | Sharangpani et al. | |

* cited by examiner

SELF-ALIGNED NANODOTS FOR 3D NAND FLASH MEMORY

CROSS-REFERENCE TO RELATED APPLICATIONS

This application claims benefit of U.S. Provisional Patent Application Ser. No. 62/457,227 filed Feb. 10, 2017, which is incorporated herein by reference.

BACKGROUND

Field

Embodiments of the present invention generally relate to semiconductor systems, processes, and equipment. More specifically, the present technology relates to systems and methods for selectively depositing nanodots in a vertically oriented memory structure.

Description of the Related Art

For pursuing the rapid integration density path of floating gate beyond the 10 nm generation, 3D NAND devices are considered as the most promising near-term solution. Some of the current solutions use a deposited poly silicon ("poly-Si") channel. For example, vertical NAND relies also on poly-Si channel devices and consists of a charge trapped device with a vertical cylindrical geometry. The channel is made of an approximately 10 nm thick deposited poly-Si layer and the integration of such devices has already been proven.

However, improvements are needed in the area of fabrication of vertical NAND and other three-dimensional based semiconductor structures and devices.

SUMMARY

In an embodiment, a method of forming a 3D NAND structure having self-aligned nanodots includes depositing alternating layers of an oxide and a nitride on a substrate; at least partially recessing the nitride layers; and forming SiGe nanodots on the nitride layers.

In an embodiment, a method of forming a 3D NAND structure having self-aligned nanodots includes depositing alternating layers of an oxide and a nitride on a substrate; at least partially recessing the nitride layers; and forming SiGe nanodots on the nitride layers by a process including maintaining a temperature of the substrate below about 560° C.; flowing a silicon epitaxy precursor into the chamber; forming a silicon epitaxial layer on the substrate at the nitride layers; flowing germanium gas into the chamber with the silicon epitaxy precursor; and forming a silicon germanium epitaxial layer on the substrate at the nitride layers.

In an embodiment, a method of forming a 3D NAND structure having self-aligned nanodots includes depositing alternating layers of an oxide and a nitride on a substrate; at least partially recessing the nitride layers; forming SiGe nanodots on the nitride layers by: flowing a silicon epitaxy precursor into the chamber; forming a silicon epitaxial layer on the substrate at the nitride layers; flowing germanium gas into the chamber with the silicon epitaxy precursor; and forming a silicon germanium epitaxial layer on the substrate at the nitride layers; after forming the silicon germanium epitaxial layer, discontinuing flow of the germanium gas; and depositing silicon on the silicon germanium epitaxial layer, wherein during forming the silicon epitaxial layer, forming the silicon germanium epitaxial layer, and depositing silicon: a temperature of the substrate is maintained below about 560° C., a flow rate of the silicon epitaxy precursor is maintained substantially constant, and a pressure of the chamber is maintained at 50 Torr.

In an embodiment, a method of forming self-aligned nanodots includes disposing a substrate in a chamber, the substrate having alternating nitride and oxide layers; flowing a silicon epitaxy precursor into the chamber; forming a silicon epitaxial layer on the substrate at the nitride layers; flowing germanium gas into the chamber with the silicon epitaxy precursor; and forming a silicon germanium epitaxial layer on the substrate at the nitride layers.

In one or more embodiments disclosed herein, the method also includes, after forming the silicon germanium epitaxial layer, discontinuing the flow of the germanium gas.

In one or more embodiments disclosed herein, the method also includes, after discontinuing the flow of the germanium gas, continuing to flow the silicon epitaxy precursor into the chamber to deposit silicon on the substrate at the nitride layers.

In an embodiment, a method of forming a 3D NAND structure having self-aligned nanodots includes depositing alternating layers of an oxide and a nitride on a substrate; at least partially recessing the nitride layers; and forming nanodots on the nitride layers.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Fabrication of self-aligned nanodots may enable 3D NAND structures to adopt many of the advantages of floating gates. This may provide improved performance over 2D floating gates. Typically, the fabrication of self-aligned nanodots by epi chamber does not require many additional processing steps. The fabrication of self-aligned nanodots by epi chamber may be compatible with current 3D NAND integration flows. The fabrication of self-aligned nanodots by epi chamber may efficiently utilize epi chamber equipment in memory technology space.

It is generally believed that charge traps in NAND applications may have reliability and erase saturation issues, such as a permanent logic "1", rendering the cell useless. Floating gates may be advantageous over current charge trap ONO (i.e., oxide-nitride-oxide) structures. Fabrication of floating gates on 3D NAND, however, may require significant modification to current integration flows and significant additional research, development, and/or manufacturing costs.

Epi processes may enhance the self-aligned floating gate fabrications with a-Si (i.e., amorphous silicon) and a-SiGe (i.e., amorphous silicon germanium). For example, such epi processes may facilitate Ge intermixing with Si when they are adjacent amorphous layers, rather than in crystalline form. The kinetics of intermixing is thought to be more favorable as Ge concentrations increase, and/or as the adjacent a-Si layer thicknesses are thinner. Self-aligned SiGe deposition may preferentially occur on nitride over oxide in ONON stacks. For example, when the intermixing between a-Si and a-SiGe layer occurs, the agglomeration process may preferentially occur on silicon nitrides, rather than on silicon oxides. This selective deposition may be due to more dangling bonds available on nitrides than oxides. The differential agglomeration of Si and SiGe layers on nitrides may lead to excellent self-aligned deposition of SiGe films. The differential agglomeration of Si and SiGe layers on nitrides may potentially provide methods for the floating gate fabrications in 3D NAND applications by epi chamber.

It should be appreciated that the resultant SiGe nanostructures may include true nanodots, nanograins, and amorphous layers. For ease of reference, such nanostructures will be referred to herein as "nanodots."

Figure 1:
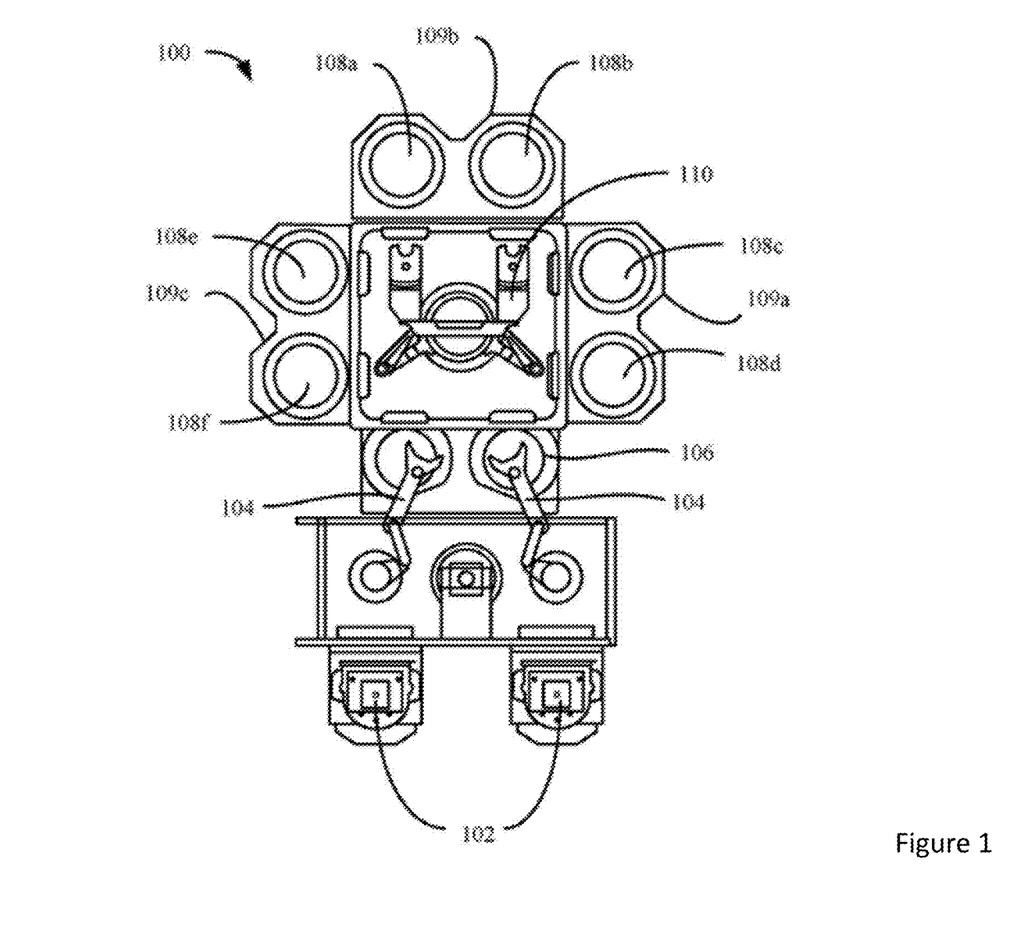
FIG. 1 shows a top plan view of an exemplary processing system according to the present technology.

FIG. 1 shows a top plan view of one embodiment of a processing system 100 of deposition, etching, baking, and curing chambers according to disclosed embodiments. In the figure, a pair of front opening unified pods ("FOUPs") 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the etch processes described herein in addition to cyclical layer deposition, atomic layer deposition, chemical vapor deposition, physical vapor deposition, etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chamber (e.g., 108c-d and 108e-f) may be used to deposit dielectric material on the substrate, and the third pair of processing chambers (e.g., 108a-b) may be used to etch the deposited dielectric. In another configuration, all three pairs of chambers (e.g., 108a-f) may be configured to etch a material on the substrate. Any one or more of the processes described below may be carried out in chamber(s) separated from the fabrication system shown in different embodiments. It will be appreciated that additional configurations of deposition, etching, annealing, and curing chambers for dielectric films are contemplated by system 100. Any of the chambers described below may be utilized in the processing system 100, and may be included as tandem chambers, which may include two similar chambers sharing precursor, environmental, or control features.

Figure 2:
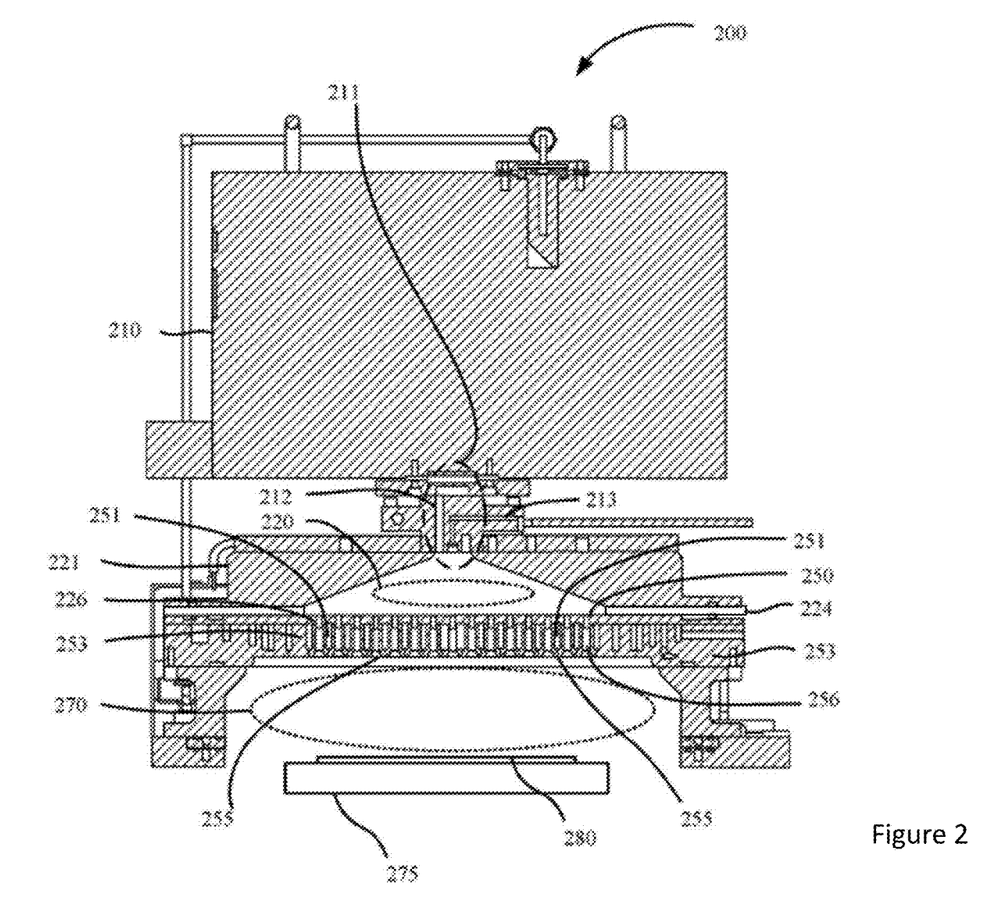
FIG. 2 shows a schematic cross-sectional view of an exemplary processing chamber according to the present technology.

FIG. 2 shows a cross-sectional schematic of an exemplary processing chamber 200 that may be utilized in operations of the present technology. Chamber 200 may be used, for example, in one or more of the processing chamber sections 108 of the system 100 previously discussed. Chamber 200 may deliver and activate precursors via thermal heating, or may utilize plasma generation. A remote plasma system ("RPS") 210 may process a gas which then travels through a gas inlet assembly 211. Two distinct gas supply channels may be present within the gas inlet assembly 211. A first channel 212 may carry a gas that passes through the RPS 210, while a second channel 213 may bypass the RPS 210. The first channel 212 may be used for the process gas and the second channel 213 may be used for a treatment gas in disclosed embodiments. The lid or conductive top portion 221 and a perforated partition, such as showerhead 253, are shown with an insulating ring 224 disposed between, which may allow an AC potential to be applied to the lid 221 relative to showerhead 253. The process gas may travel through first channel 212 into chamber plasma region 220 and may be excited by a plasma in chamber plasma region 220 alone or in combination with RPS 210. The combination of chamber plasma region 220 and/or RPS 210 may be referred to as a remote plasma system herein. The perforated partition or showerhead 253 may separate chamber plasma region 220 from a substrate processing region 270 beneath showerhead 253. Showerhead 253 may allow a plasma present in chamber plasma region 220 to avoid directly exciting gases in substrate processing region 270, while still allowing excited species to travel from chamber plasma region 220 into substrate processing region 270.

Showerhead 253 may be positioned between chamber plasma region 220 and substrate processing region 270 and allow plasma effluents or excited derivatives of precursors or other gases created within chamber plasma region 220 to pass through a plurality of through-holes 256 that traverse the thickness of the plate or plates included in the showerhead. The precursors and/or plasma derivatives may combine in processing region 270 in order to produce films that may be deposited on substrate 280 positioned on a substrate support 275. The showerhead 253 may also have one or more hollow volumes 251 that can be filled with a precursor in the form of a vapor or gas, such as a silicon-containing precursor, and pass through small holes 255 into substrate processing region 270, but not directly into chamber plasma region 220. Showerhead 253 may be thicker than the length of the smallest diameter 250 of the through-holes 256 in disclosed embodiments. In order to maintain a significant concentration of excited species penetrating from chamber plasma region 220 to substrate processing region 270, the length 226 of the smallest diameter 250 of the through-holes may be restricted by forming larger diameter portions of through-holes 256 part way through the showerhead 253. The length of the smallest diameter 250 of the through-holes 256 may be the same order of magnitude as the smallest diameter of the through-holes 256 or less in disclosed embodiments.

In the embodiment shown, showerhead 253 may distribute, via through-holes 256, process gases which contain a plasma vapor/gas such as argon, for example. Additionally, the showerhead 253 may distribute, via smaller holes 255, a silicon-containing precursor that is maintained separately from the plasma region 220. The process gas or gases and the silicon-containing precursor may be maintained fluidly separate via the showerhead 253 until the precursors separately enter the processing region 270. The precursors may contact one another once they enter the processing region and react to form a flowable dielectric material on substrate 380, for example.

Chamber 200 may be used to deposit materials or perform operations discussed in relation to the present technology. Chamber 200 may also not utilize plasma in the operations performed, and may instead thermally activate precursors delivered into the chamber, or may allow precursors to chemically react with one another. Chamber 200 is included only as an exemplary chamber that may be utilized in conjunction with the present technology. It is to be understood that operations of the present technology may be performed in chamber 200 or any number of other deposition, etching, or reactive chambers.

SiGe growth on dielectric film can be challenging, as the film tends to agglomerate and grow as a nonconformal layer on blanket oxide. Typically, in order to grow conformal layers for 3D NAND applications, an amorphous Si layer is first grown. Next, a-SiGe layer is grown.

Figure 3:
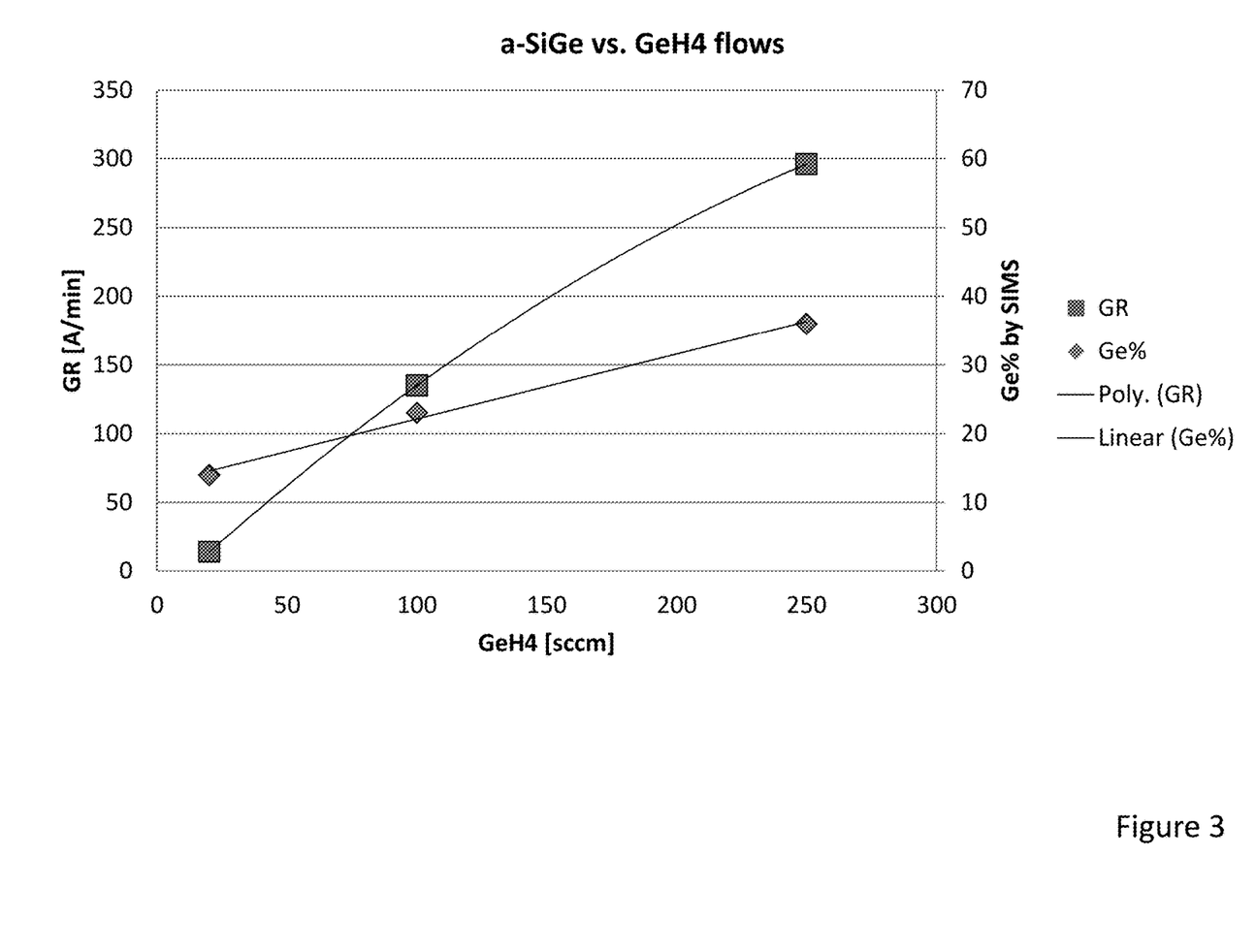
FIG. 3 shows a graph illustrating SiGe process sensitivity.

To deposit a SiGe layer, the sources may be SiH4 and GeH4 for SiGe at 50 Torr, at 550 C. By varying the GeH4 flow rates with constant SiH4 flows, different Ge concentrations may be obtained. FIG. 3 shows a graph illustrating SiGe process sensitivity. Ge intermixing with a-Si layer may be observed to occur when the Ge concentrations are as high as 36%. Mixing diffusion of Ge into a-Si may preferentially work better on nitride rather than on oxide. With thinner layers, the intermixing process can cause the films to become not continuous. The thinner film thickness may result in disconnected and/or agglomerated SiGe nanodots on a dielectric surface.

Self-aligned agglomeration may be observed when the thin a-Si and a-SiGe layers are deposited in ONON stacks of 3D NAND structure. The recess of oxide layers may be made with a selective SiCoNi oxide removal process. Nitride may be recessed prior to SiGe deposition. The nominal deposition of a-Si and a-SiGe may be targeted for conformal film deposition for 3D NAND channels. In some embodiments, possibly due to Ge intermixing with a-Si layer, agglomeration of a-Si and a-SiGe may result in deposition only on the nitride, and no deposition on the oxide in the 3D NAND structure. In some embodiments, this agglomeration may be self-aligned to nitride only, leaving no deposition on the oxide. It is currently believed that the preferential agglomeration to the nitrides over oxides may be due to nitride having more dangling bonds available. This may provide better nucleation site than the oxide surface.

The self-aligned SiGe deposition on the nitride may be used for the floating gate fabrication method for 3D NAND applications. In some embodiments, conformal deposition may be achieved. In some embodiments, the method may be performed in an epi chamber.

Figure 4:
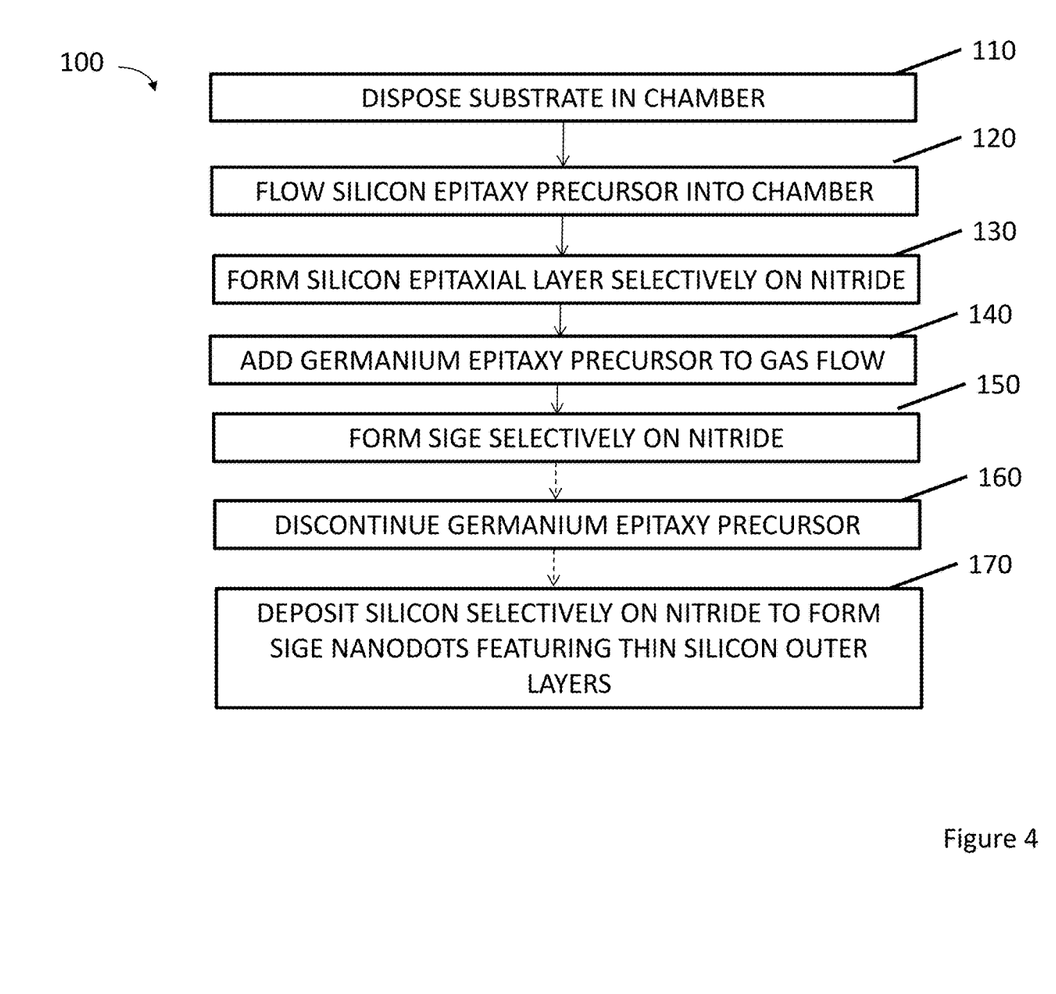
FIG. 4 illustrates an exemplary method according to embodiments according to the present technology.

FIG. 4 illustrates an exemplary method 100 of forming self-aligned nanodots. The method begins at step 110, wherein a substrate is disposed in a chamber having a processing volume. The substrate may have nitride and oxide layers. At step 120, a silicon epitaxy precursor is flowed into the chamber. For example, SiH$_4$ may be flowed into the chamber. In some embodiments, the SiH$_4$ may be flowed at a rate of about 250 sccm. At step 130, a silicon epitaxial layer is formed selectively on the substrate at the nitride layers. In some embodiments, the silicon epitaxy precursor is flowed for up to 90 s to form the epitaxial layer. In some embodiments, the substrate may be held at a temperature of about 550° C. while the silicon epitaxial layer is formed. In some embodiments, the processing volume of the chamber may be held at about 50 Torr while the silicon epitaxial layer is formed. At step 140, germanium may be added to the silicon epitaxy precursor flow. For example, GeH$_4$ may be flowed into the chamber while the silicon epitaxy precursor is flowed. In some embodiments, the GeH$_4$ may be flowed at a rate of about 200 sccm, and the SiH$_4$ may continue to be flowed at a rate of about 250 sccm. At step 150, a silicon germanium epitaxial layer is formed selectively on the substrate at the nitride layers. In some embodiments, the germanium gas is flowed for up to 77 s to form the epitaxial layer. In some embodiments, the substrate may be held at a temperature of about 550° C. while the silicon germanium epitaxial layer is formed. In some embodiments, the processing volume of the chamber may be held at about 50 Torr while the silicon epitaxial layer is formed. In some embodiments, the method continues at optional step 160, wherein the germanium gas flow may be discontinued, while the silicon epitaxy precursor continues to be flowed into the chamber. For example, SiH$_4$ may continue to be flowed into the chamber. In some embodiments, the SiH$_4$ may continue to be flowed at a rate of about 250 sccm. In some embodiments, the method continues at optional step 170, wherein a silicon may be selectively deposited on the substrate at the nitride layers to form SiGe nanodots. In some embodiments, the silicon epitaxy precursor is flowed for up to 90 s to form the SiGe nanodots. In some embodiments, the substrate may be held at a temperature of about 550° C. while the SiGe nanodots are formed. In some embodiments, the processing volume of the chamber may be held at about 50 Torr while the SiGe nanodots are formed.

Figure 5:
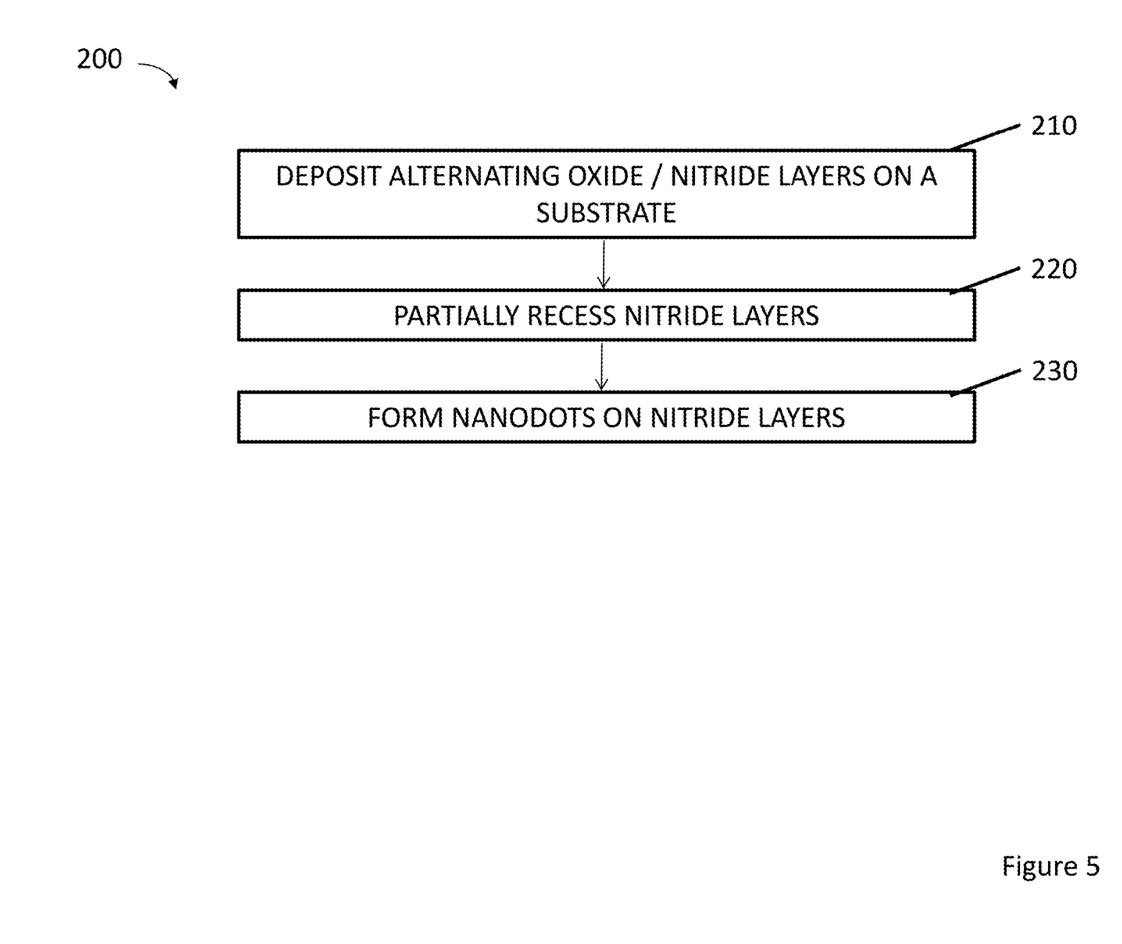
FIG. 5 illustrates another exemplary method according to embodiments according to the present technology.

FIG. 5 illustrates an exemplary method of forming an 3D NAND structure having self-aligned nanodots. The method begins at step 210, wherein alternating layers of an oxide and a nitride are deposited on a substrate. At step 220, the regions of nitride may be partially recessed via any number of etching operations. Once recessed, many conventional technologies may simply line the nitride with polysilicon. The method continues at step 230, wherein nanodots are formed on the recessed nitride layers. The nanodots may be formed according to the method presented in FIG. 4. Forming the nanodots may include some deposition of silicon and/or nanodots on the oxide layers. The nanodots may be selectively deposited on the recessed portions of the nitride. The selective deposition may be performed to form or deposit the nanodots vertically within each nitride layers, while limiting the deposition, or not depositing or forming nanodots on the oxide material located between the nitride layers.

Process conditions may also facilitate formation of the nanodot materials. For example, temperature may affect the rate of deposition, and thus although lower temperatures may be used in the process, the temperature may be maintained above about 500° C. to provide an adequate deposition rate. Additionally, the temperature may be maintained below a crystalline formation temperature of silicon in order to form an amorphous material. Accordingly, in embodiments the temperature of the two operations may be performed below about 580° C. For SiGe nanodots, SiGe may form a crystalline structure at a lower temperature than silicon. Thus, by maintaining the temperature below 580° C., SiGe nanodots may be formed. Accordingly, other silicon-containing materials that form crystalline structures at a temperature below 580° C. may also be used. In one non-limiting example, both operations may be performed at 500° C., although temperatures between about 500° C. and about 580° C. may be used, as well as temperatures from about 450° C. or below to about 560° C. or above. In embodiments a chamber pressure may be between about 1 Torr and about 100 Torr, and in one non-limiting example, the pressure for both operations may be maintained at about 50 Torr. In some embodiments, a high hydrogen carrier gas may be used.

What is claimed is:

1. A method of forming a 3D NAND structure having self-aligned nanodots comprising:
depositing alternating layers of an oxide and a nitride on a substrate;
at least partially recessing the nitride layers;
forming SiGe nanodots on the nitride layers by:
flowing a silicon epitaxy precursor into a chamber;
forming a silicon epitaxial layer on the substrate at the nitride layers;
flowing germanium gas into the chamber with the silicon epitaxy precursor; and
forming a silicon germanium epitaxial layer on the substrate at the nitride layers;
after forming the silicon germanium epitaxial layer, discontinuing flow of the germanium gas; and
depositing silicon on the silicon germanium epitaxial layer,
wherein during forming the silicon epitaxial layer, forming the silicon germanium epitaxial layer, and depositing silicon:
a temperature of the substrate is maintained below about 560° C.,
a flow rate of the silicon epitaxy precursor is maintained substantially constant, and
a pressure of the chamber is maintained at 50 Torr.

* * * * *